US008274136B2

(12) United States Patent
Makarov et al.

(10) Patent No.: US 8,274,136 B2
(45) Date of Patent: Sep. 25, 2012

(54) SEMICONDUCTOR PATCH ANTENNA

(75) Inventors: Sergey N. Makarov, Holden, MA (US); Reinhold Ludwig, Paxton, MA (US); Francesca Scire-Scappuzzo, Lexington, MA (US); John McNeill, Stow, MA (US)

(73) Assignee: Worcester Polytechnic Institute, Worcester, MA (US)

( * ) Notice: Subject to any disclaimer, the term of this patent is extended or adjusted under 35 U.S.C. 154(b) by 183 days.

(21) Appl. No.: 12/757,506

(22) Filed: Apr. 9, 2010

(65) Prior Publication Data

US 2010/0258919 A1 Oct. 14, 2010

Related U.S. Application Data

(60) Provisional application No. 61/168,119, filed on Apr. 9, 2009.

(51) Int. Cl.
*H01L 29/868* (2006.01)
*H01L 21/329* (2006.01)
*H01L 21/02* (2006.01)

(52) U.S. Cl. ................ 257/531; 257/656; 257/E29.336; 257/E21.352; 257/E21.022; 438/478

(58) Field of Classification Search .................. 257/531, 257/656, E29.336, E21.352, E21.022; 438/478
See application file for complete search history.

(56) References Cited

U.S. PATENT DOCUMENTS

| | | | | |
|---|---|---|---|---|
| 4,780,724 | A * | 10/1988 | Sharma et al. | 343/700 MS |
| 7,612,728 | B2 | 11/2009 | Heinrich et al. | |
| 7,649,496 | B1 * | 1/2010 | Silver et al. | 343/700 MS |
| 7,964,932 | B2 * | 6/2011 | Silver et al. | 257/498 |
| 2009/0026579 | A1 * | 1/2009 | Silver et al. | 257/603 |

FOREIGN PATENT DOCUMENTS

EP 1793451 A1 6/2007

OTHER PUBLICATIONS

Saxena, N. K., "Radiation and switchable characteristic of a microstrip antenna with hall-effected doped semiconductor substrate," Proceedings of the 2008 URSI General Assembly.
Bijumon, P.V., et al., On-chip silicon integrated cylindrical dielectric resonator antenna for millimeter wave applications, pp. 489-492, IEEE (2007).
Sedaghat-Pisheh, H., et al., "Design, simulation, and fabrication of an on-chip antenna fabricated using silicon micromachining for broadband millimeter-wave wireless communications," Proceedings of the 36th European Microwave Conference, Sep. 2006, pp. 1446-1448.
Ahmadi, M., et al., "An efficient CMOS on-chip antenna structure for system in package transceiver applications," pp. 487-490, IEEE (2007).

* cited by examiner

*Primary Examiner* — Victor A Mandala
(74) *Attorney, Agent, or Firm* — Burns & Levinson LLP; Jacob N. Erlich; Orlando Lopez

(57) ABSTRACT

A semiconductor patch antenna for microwave radiation having a wide pin-junction or pn-junction with the depletion region or embodiments having a separating buried oxide ($SiO_2$) layer between p- and n-doped regions as the natural resonator volume. Embodiments that do not include a metal ground plane and/or a metal patch are disclosed.

10 Claims, 12 Drawing Sheets

Direct pn-junction. The antenna gap is the depletion layer width

A pin-junction (PIN diode). The antenna gap is the Si width plus the depletion layer width A pn-junction with a buried Si dioxode layer. The antenna gap is the oxide width plus the depletion layer width

SEMICONDUCTOR PATCH ANTENNA

CROSS-REFERENCE TO RELATED APPLICATIONS

The present application claims priority to U.S. Provisional Application No. 61/168,119 filed Apr. 9, 2009 entitled SEMICONDUCTOR PATCH ANTENNA, which is incorporated herein in its entirety by reference.

BACKGROUND

The present teachings relate generally to high-frequency radiators and, more particularly, to microstrip patch antennas.

Antennas have been integrated on to silicon wafers. Examples of different classes of doing so include:

1. At GHz frequencies, conventional metal patches and strips with switching diodes have been used;
2. At mm-wave frequencies, deposited metal spirals and tapered-slot antennas with long metal wings have been used;
3. In the THz frequency range, the conventional approach has also used a metal antenna. Problems with metal antennas in the THz band include weak coupling with the on-chip mixer or rectifier; and
4. Recently, Dielectric Resonator Antennas ("DRA") on silicon have been suggested at 60 GHz and realized at 7.5 GHz.

At least one problem associated with such antennas is the coupling loss behavior. As the operating frequency approaches the mm-wave and THz range, coupling loss at the interface to conventional antennas becomes more critical, especially when additional components are required for functions such as tuning and impedance matching. Other problems include trying to make an antenna dynamically tunable. As the frequency increases to mm-waves and THz frequencies, the potential antenna tenability becomes vital for proper impedance matching.

What is needed is a better antenna to solve these and other problems.

SUMMARY

The needs set forth herein as well as further and other needs and advantages are addressed by the present embodiments, which illustrate solutions and advantages described below.

The system of the present embodiment includes, but is not limited to, a patch antenna for microwave radiation comprising a wide semiconductor pn-junction having the depletion region as the natural resonator volume.

Other embodiments are described in detail below and are also part of the present teachings.

For a better understanding of the present embodiments, together with other and further aspects thereof, reference is made to the accompanying drawings and detailed description and its scope will be pointed out in the appended claims.

DETAILED DESCRIPTION

The present teachings are described more fully hereinafter with reference to the accompanying drawings, in which the present embodiments are shown. The following description is presented for illustrative purposes only and the present teachings should not be limited to these embodiments.

As discussed above, the existing classes of antennas integrated into silicon wafers have many problems. These include coupling loss behavior, which becomes more critical as the operating frequency approaches the mm-wave and THz range, as well as the ability to dynamically tune the antenna, which is vital for the proper impedance matching as the frequency increases to mm-waves and THz frequencies. These existing classes, however, do not suggest the use of a semiconductor pn junction as an antenna type.

The present teachings relate to a semiconductor patch antenna. This may be used for microwave radiation, in one instance from about 50 GHz to about 1 THz, although not limited thereto. The semiconductor patch antenna uses non-traditional highly-doped semiconductor pin junction-based (in some embodiments, pn junction based) transmission lines instead of a traditional metal transmission lines. Embodiments that do not include a metal ground plane and/or a metal plate are within the scope of these teachings.

The resonating volume of the semiconductor patch antenna is the depletion region of the pin-junction (in some embodiments, the pn junction) with the low carrier concentration, e.g., the low loss tangent and a low absorption. The antenna is integrated into a silicon ("Si") or Gallium Arsenide ("GaAs") wafer, although not limited thereto. A semiconductor patch antenna so constructed may be used at GHz frequencies, for mm waves, or for THz radiation, although not limited thereto.

The semiconductor composition includes the p- and n-doping specimens with doping concentrations (both donor and acceptor) on the order of approximately $10^{18}$-$10^{20}$ cm$^{-3}$, although not limited thereto. The semiconductor patch antenna may use the pin-junction, or the pn-junction with a thin buried oxide layer or, in some embodiments, the pn-junction, although not limited thereto. In the embodiments analyzed to date, semiconductor patch antennas utilizing the pin junction exhibit higher efficiency, which is a desirable characteristic.

Figure 1:
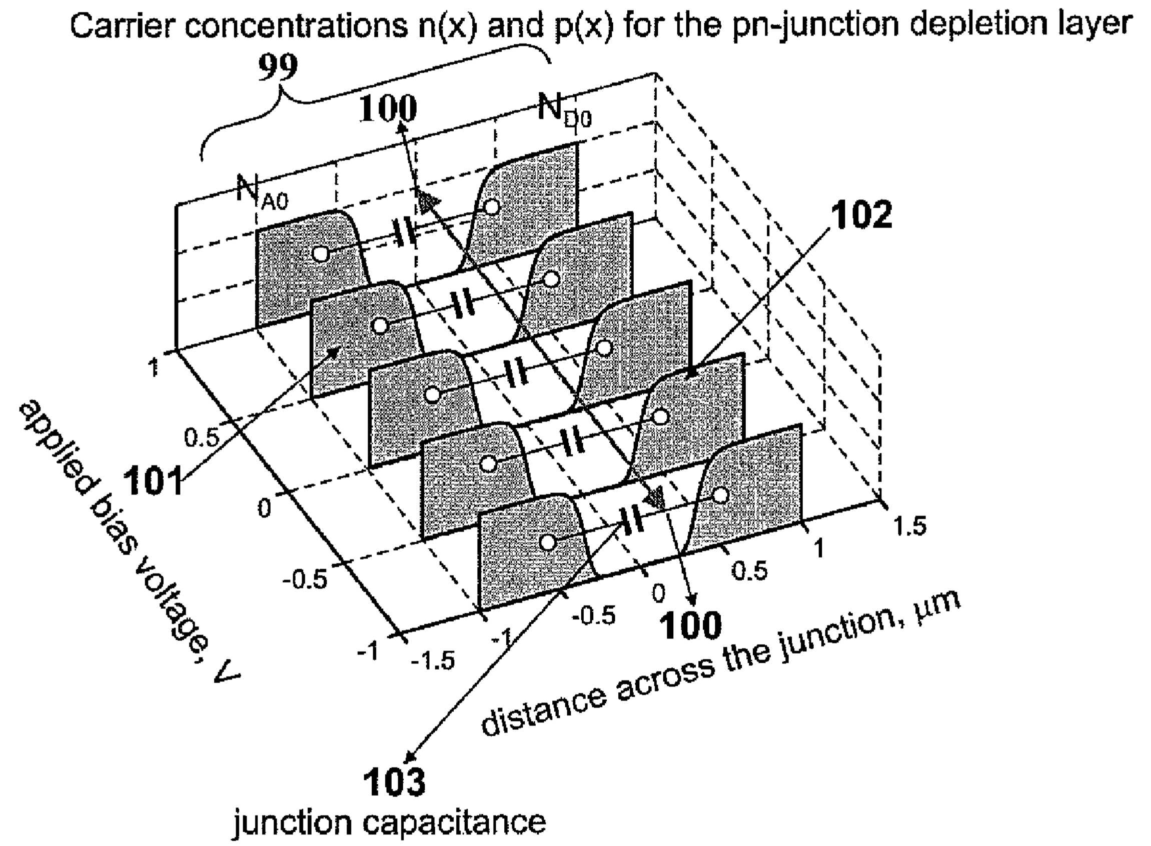
FIG. 1 is a perspective view of a graph showing a wide semiconductor pn-junction and depletion region.

Referring now to FIG. 1, shown is a perspective view of a graph showing a wide semiconductor pn junction 100. The pn-junction 100 includes the metallurgical junction of the heavily-doped p-side (also referred to as a p-doped layer) 101 and the heavily-doped n-side (also referred to as an n-doped layer) 102 and the depletion region in the middle of the pn-junction 100. One advantage of the semiconductor patch antenna is that it is tunable by changing the applied reverse-bias voltage. (The applied reverse-bias voltage is applied by connecting a DC voltage source between the p-doped region and the n-doped region, in a manner similar to the applied bias voltage in a pn diode.) Another aspect of the semiconductor patch antenna of these teachings is the use of the depletion region of a semiconductor pn-junction 100 (or similarly pin structure or p-oxide-n structure) for signal transmission in the direction along, but not across, the pn-junction 100 (or similarly pin structure or p-oxide-n structure). Although FIG. 1 refers to a pn junction, a similar figure and description corresponds to a pin junction. (In the pin junction, there is an intrinsic Si (silicon) (an intrinsic semiconductor) layer between the p-side and the n-side.)

Since the depletion region is free of charge carriers at zero and negative bias voltages, it possesses a very low conductivity (and a low loss tangent) on the order of intrinsic silicon. At the same time, it has a certain static depletion capacitance per unit length 103, much as the parallel-plate transmission line has a distributed static capacitance.

A further aspect of the semiconductor patch antenna of these teachings is use of the wide depletion region at the pn-junction 100, or, similarly, of a pin-junction, as a transmission line. The depletion region has two necessary ingredients of a transmission line: 1) a lengthy carrier-free region between two high carrier-concentration zones (conductors); and, 2) an appreciable depletion capacitance per unit length 103. It is noted that the static (immovable doping ions) charges also exist along that transmission line. Since the charges are fixed in the lattice, this does not preclude RF transmission line operation.

Figure 2A:
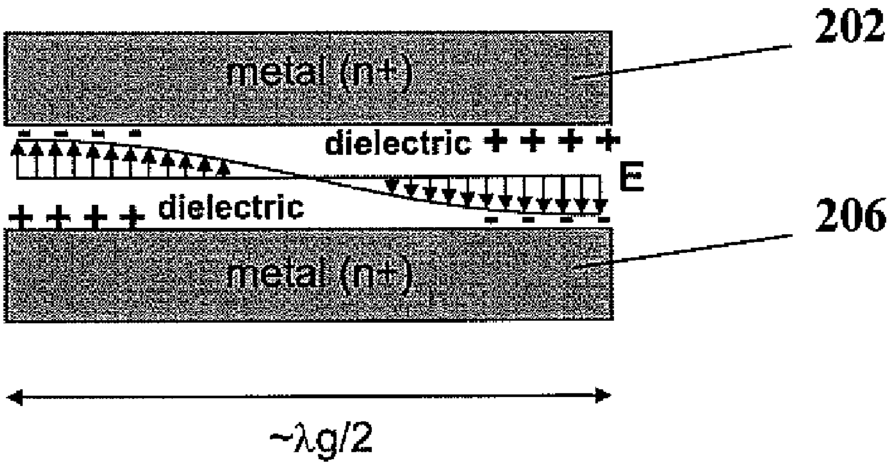
FIG. 2A is a schematic illustration depicting a metal transmission line half-wave resonator.
Figure 2B:
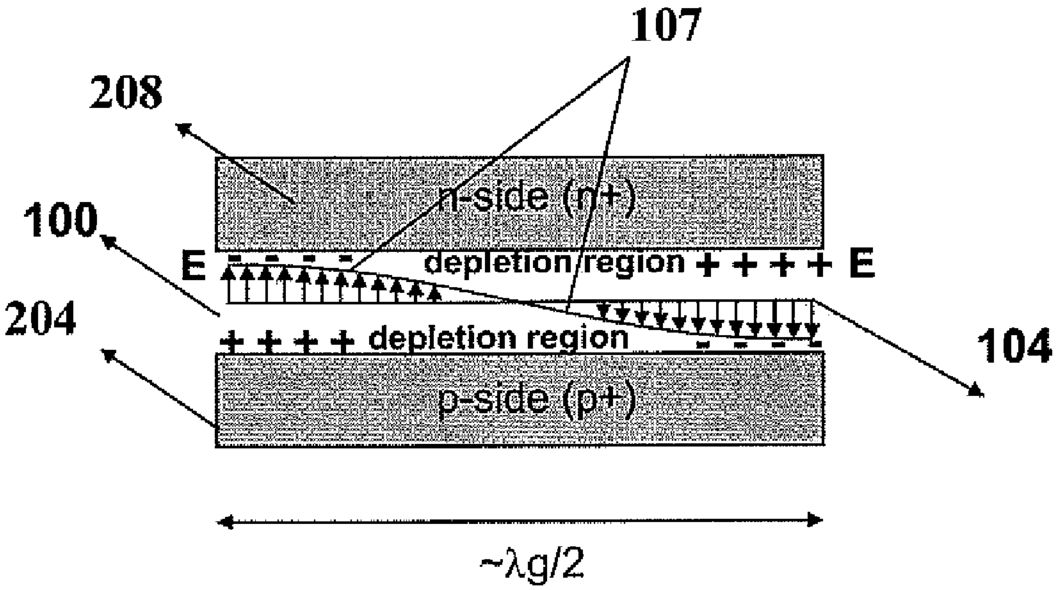
FIG. 2B is a schematic illustration depicting a semiconductor transmission line half-wave resonator.

Referring now to FIG. 2A, shown is a schematic illustration depicting a metal transmission line half-wave resonator. This is shown to compare with the half-wave resonator in FIG. 2B. Referring now to FIG. 2B, shown is a schematic illustration depicting a semiconductor transmission line half-wave resonator. Once the transmission line is created, a half-wave transmission-line resonator 104 can be established on the base of that line. Such a half-wave resonator is similar to the metal half-wave resonator shown in FIG. 2A.

The semiconductor patch antenna of these teachings replaces the upper metal patch (of conventional patch antennas) 202 (shown in FIG. 2A) with a n-side 102 (shown in FIG. 1) semiconductor patch 208. It also replaces the lower metal ground plane (of conventional patch antennas) 206 (shown in FIG. 2A) with a p-side 101 semiconductor ground plane 204. The substrate is the depletion region 100. The oscillating electric field 107 is concentrated within the depletion region 100. The p- and n-doped regions of the semiconductor ground plane 204 and semiconductor patch 208 may be interchanged.

Figure 3A:
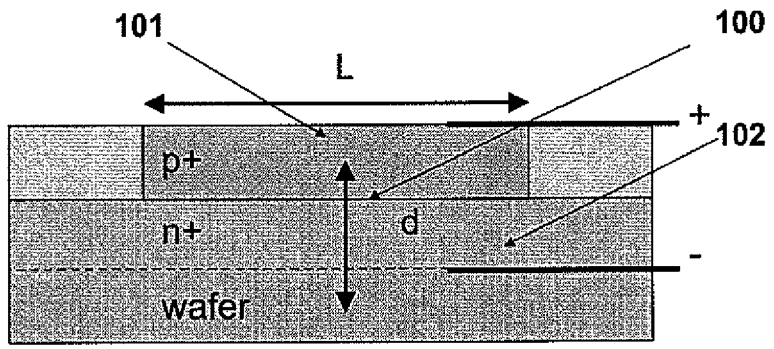
FIGS. 3A, 3B, and 3C are schematic illustrations depicting three embodiments of the semiconductor patch antenna.
Figure 3B:
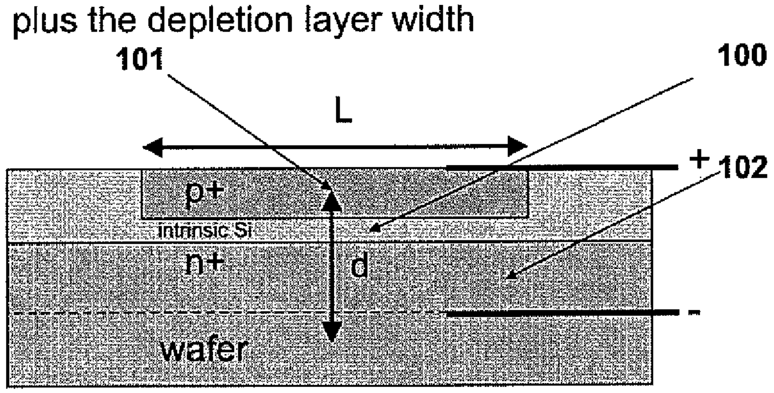
Figure 3C:
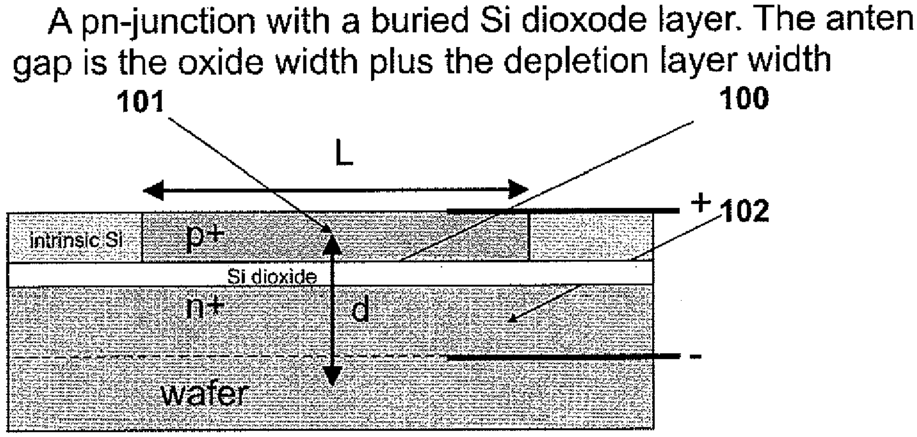

Referring now to FIGS. 3A, 3B, and 3C, shown are schematic illustrations depicting three embodiments of the semiconductor patch antenna, although the present teachings are not limited to these specific embodiments. FIG. 3A shows the semiconductor patch antenna with the direct depletion region 100 corresponding to FIG. 2B. FIG. 3B shows another embodiment in which the depletion region 100 has a thin layer of intrinsic Si (intrinsic semiconductor), i.e., it becomes the pin-junction. FIG. 3C shows a still further embodiment in which the depletion region 100 has a thin oxide layer. In FIGS. 3B and 3C, the depletion region 100 has a width considerably larger than the width of either the intrinsic Si or the Si dioxide.

Figure 4:
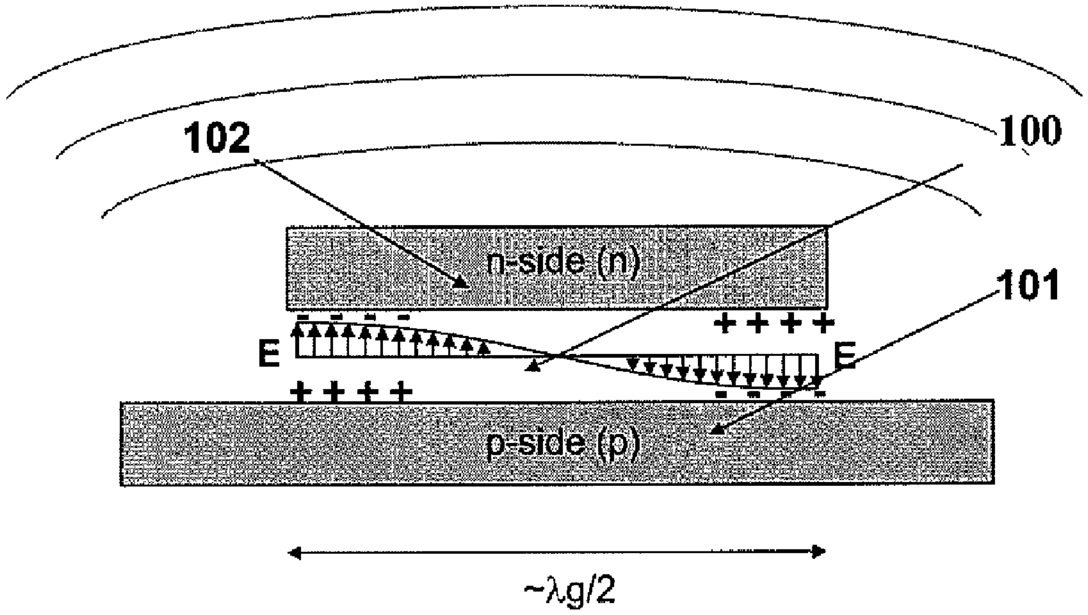
FIG. 4 is a schematic illustration depicting semiconductor patch antenna radiation.

Referring now to FIG. 4, shown is a schematic illustration depicting semiconductor patch antenna radiation. When the n-side 102 radiating patch is made smaller than the p-side 101 ground plane, the radiation pattern has the main beam which may have its maximum at the zenith as shown.

Figure 5:
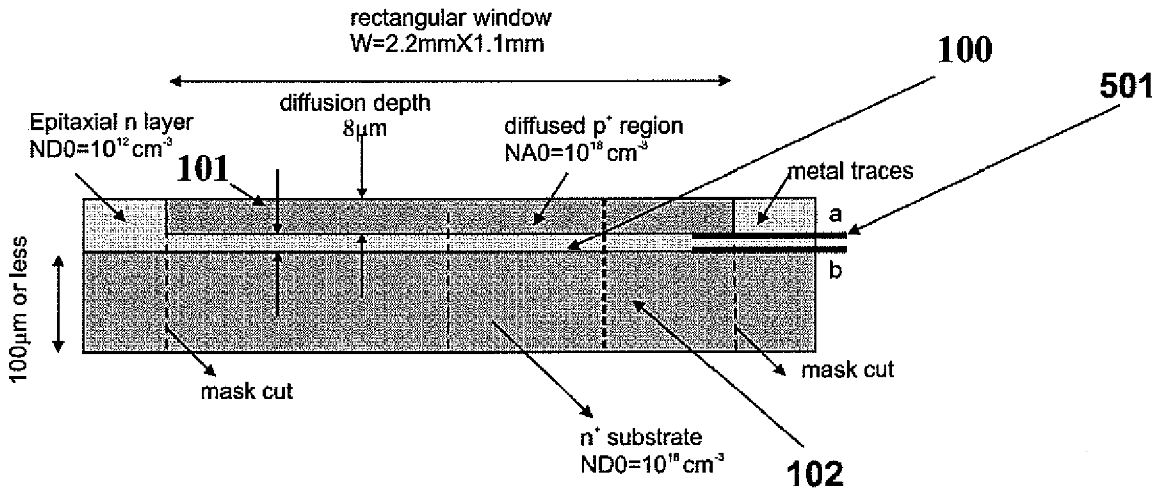
FIG. 5 is a schematic illustration depicting one embodiment of the CMOS realization of the semiconductor patch antenna.

Referring now to FIG. 5, shown is a schematic illustration depicting one embodiment of the CMOS realization of the semiconductor patch antenna. Shown are metal electrodes 501. In this example, although not limited thereto, the semiconductor patch antenna is operating at approximately 20 GHz and the doping concentrations (both donor and acceptor) are approximately $10^{18}$-$10^{20}$ $cm^{-3}$. An advantage of the semiconductor patch antenna is that it is tunable by changing the applied reverse-bias voltage. (The reverse bias voltage is applied by a DC voltage source applied between the p-doped region and the n-doped region, in a manner similar to the DC voltage across a pn diode.) Specifically, the bias voltage changes the depletion capacitance per unit length 103 (shown in FIG. 1) and the antenna input impedance. The impedance mismatch can thus be controlled simply by the DC bias voltage. However, the resonant frequency is still primarily determined by the size of the n-side 102 semiconductor patch 208 (shown in FIG. 2B).

Figure 6A:
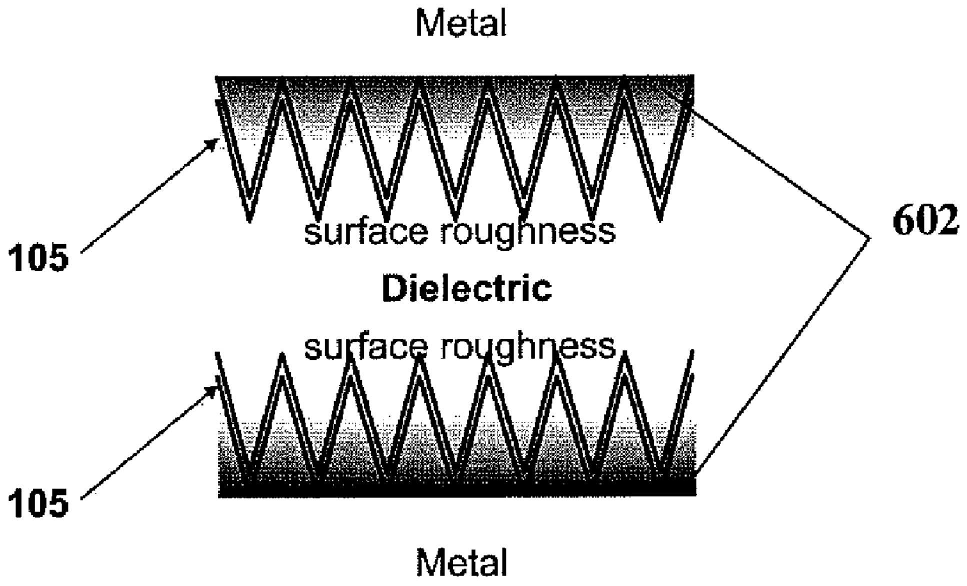
FIG. 6A is a schematic illustration depicting interfacial roughness distribution for a metal antenna.

Referring now to FIG. 6A, shown is a schematic illustration depicting interfacial roughness distribution for a metal antenna. Another advantage of the semiconductor patch antenna, in addition to reduction of coupling losses, is a reduction of the inherent losses in the antenna itself Current flow occurs in a more uniform region of material than with a metal patch antenna. The distribution of mobile charges 602 is represented by the shaded regions near the metal-dielectric interface. At high frequencies (e.g., above the 8-12 GHz X-band, etc.), current flow occurs in a region of dielectric junction surface roughness 105, which leads to higher losses than would be expected from the bulk metal conductivity.

Figure 6B:
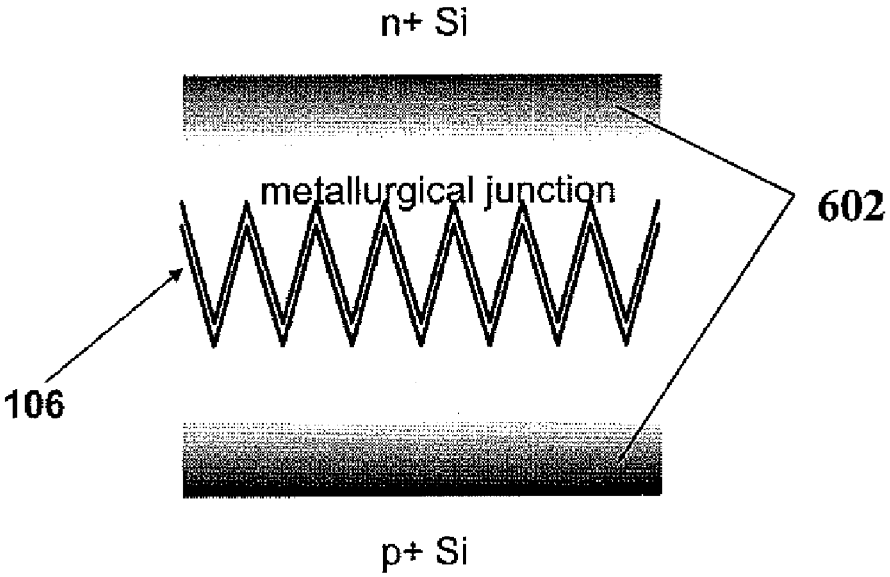
FIG. 6B is a schematic illustration depicting interfacial roughness distribution for a semiconductor patch antenna.

Referring now to FIG. 6B, shown is a schematic illustration depicting interfacial roughness distribution for a semiconductor patch antenna. This is shown for comparison with the metal antenna interfacial roughness distribution in FIG. 6A. For the semiconductor patch antenna, the mobile charges 602 are located at the boundary of the depletion region 100 (shown in FIG. 1), away from any metallurgical junction surface roughness 106. Current flows in a more uniform region, with higher conductivity characteristic of bulk material, and therefore reduced loss.

The tunability of the semiconductor patch antenna of these teachings is enabled by the changes in the channel width (or in the depletion layer width) due to the applied voltage. These changes may reach up to 100% and more for an embodiment utilizing a pn-junction. For wide channels of the type p+in+ ("pin") or p+iSiO2in+ (pn-junction with a thin buried oxide layer) the tunability approximately reduces by the factor of approximately d/D where d is the (effective) depletion layer width and D is the thickness of the intermediate intrinsic layer and/or the passivation layer. The depletion layer d still exists at the p+i and in+junctions; it is affected by the applied bias voltages similar to the ordinary pn-junction depletion layer. In one embodiment utilizing the pin junction, the estimated resulting resonant frequency change is on the order of 0.1%.

Although this number appears to be very small, it may be quite sufficient for fine antenna tuning in the band 50 GHz-1 THz.

Figure 7:
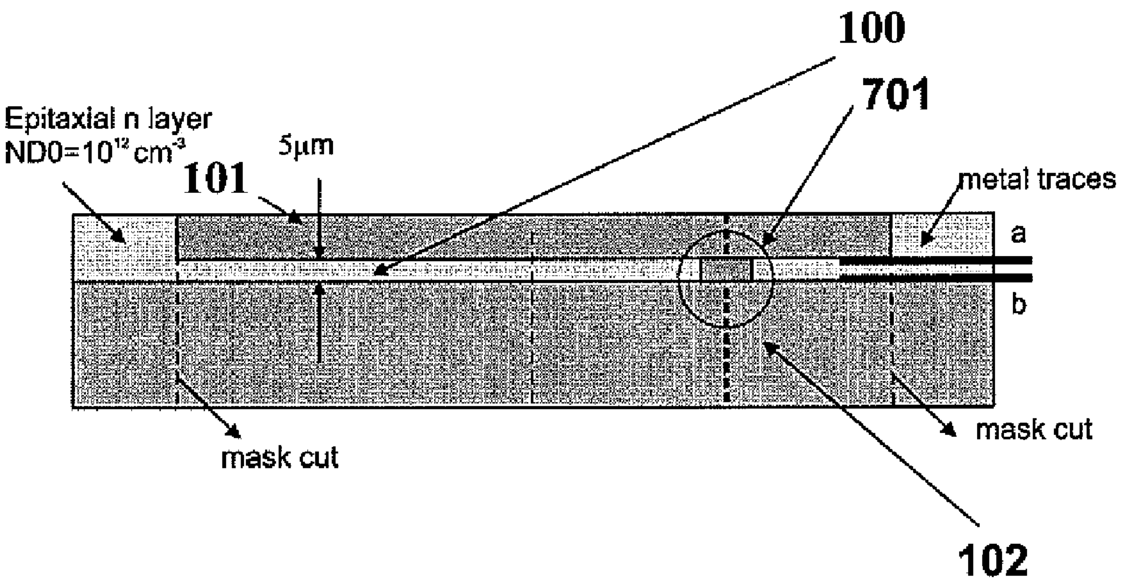
FIG. 7 is a schematic illustration depicting one embodiment of the semiconductor patch antenna and an integrated pn-junction diode.

Referring now to FIG. 7, shown is a schematic illustration depicting one embodiment of the semiconductor patch antenna and an integrated pn-junction diode 701. The semiconductor antenna may be integrated with a rectifier/mixer pn-junction diode 701. However, the speed of the pn-junction diode 701 may be slow. Therefore, integration with a Schottky barrier diode may be possible, with its rectifying characteristics, lower junction voltage, and decreased (almost non-existent) depletion width.

Figure 8:
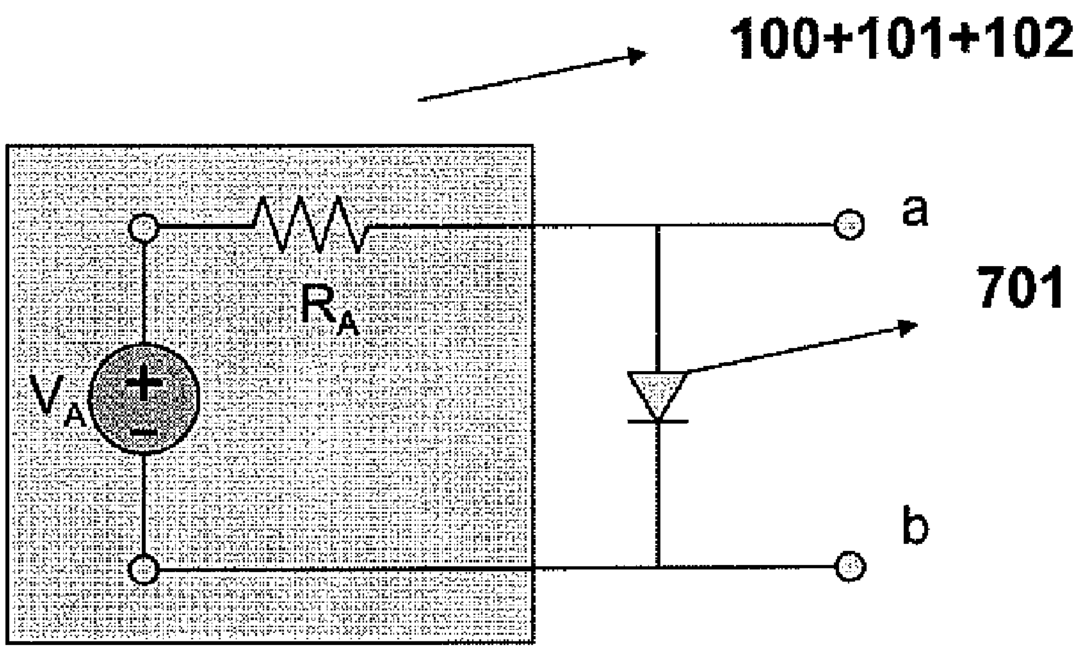
FIG. 8 is an electrical schematic diagram depicting the corresponding circuit model for FIG. 7.

Referring now to FIG. 8, shown is an electrical schematic diagram depicting the corresponding circuit model for FIG. 7. The semiconductor patch antenna may be integrated with a rectifier diode as shown for THz frequencies, but not limited thereto.

Some exemplary embodiments of these teachings, these teachings not being limited only to those exemplary embodiments, are described herein below.

A Pin-Junction Antenna

In one embodiment, the channel width is extended by either using the pin-junction instead of the pn-junction, or a separating buried oxide ($SiO_2$) layer between p- and n-doped regions. In terms of the extended channel width, the pin junction embodiment has more adaptability than the pn-junction embodiment. The typical pin-junction includes a layer of intrinsic (or compensated) Si between p- and n-doped regions. The built-in voltage is again given by $$\varphi_{bi} = V_T \ln\left(\frac{N_{A0}N_{D0}}{n_i^2}\right)$$

When the intrinsic layer is sufficient thickness, and the doping concentrations are sufficiently high, the particular value of the negative bias voltage has led us influence on the width of the depletion region, which now includes the i-region, and two small carrier-free regions on either side of the pin-junction. This is in contrast to the pn-junction where the applied bias voltage largely influences the width of the depletion region.

As an example, FIGS. 9*a*-9*e* show the carrier profiles (numerical simulation) and the associated static electric parameters for a wide pin-junction with the following parameters;

i. $N_D$ and $N_A$ of $4\times10^{16}$ $cm^{-3}$; $\Phi_{b1}$=0.79V ii. i-region width of 200 μm;

iii. doping profiles of 30 μm in width (given by a raised cosine).

Figures 9A, 9B, 9C, 9D, 9E:
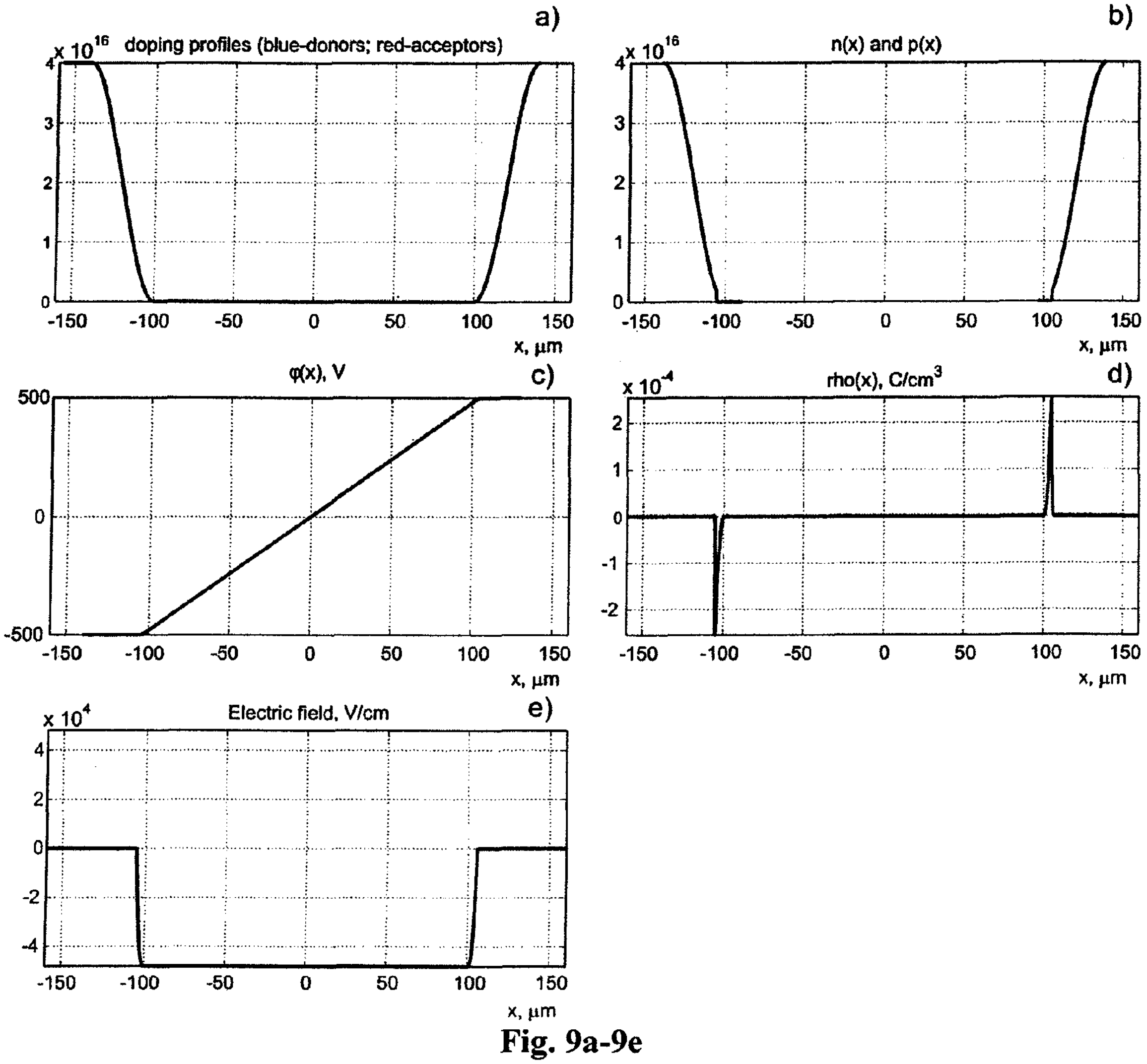
FIGS. 9*a*-9*e* show, for one embodiment of these teachings, a)—Doping profiles; b)—free carrier concentrations; c)—electric potential, d)—charge density, and e)—electric field for the pin junction with $N_D=N_A=4\times10^{16}$ cm$^{-3}$, and the i-layer width of 200 μm; The bias voltage is −1000V.
Figures 10A, 10B, 10C, 10D, 10E:
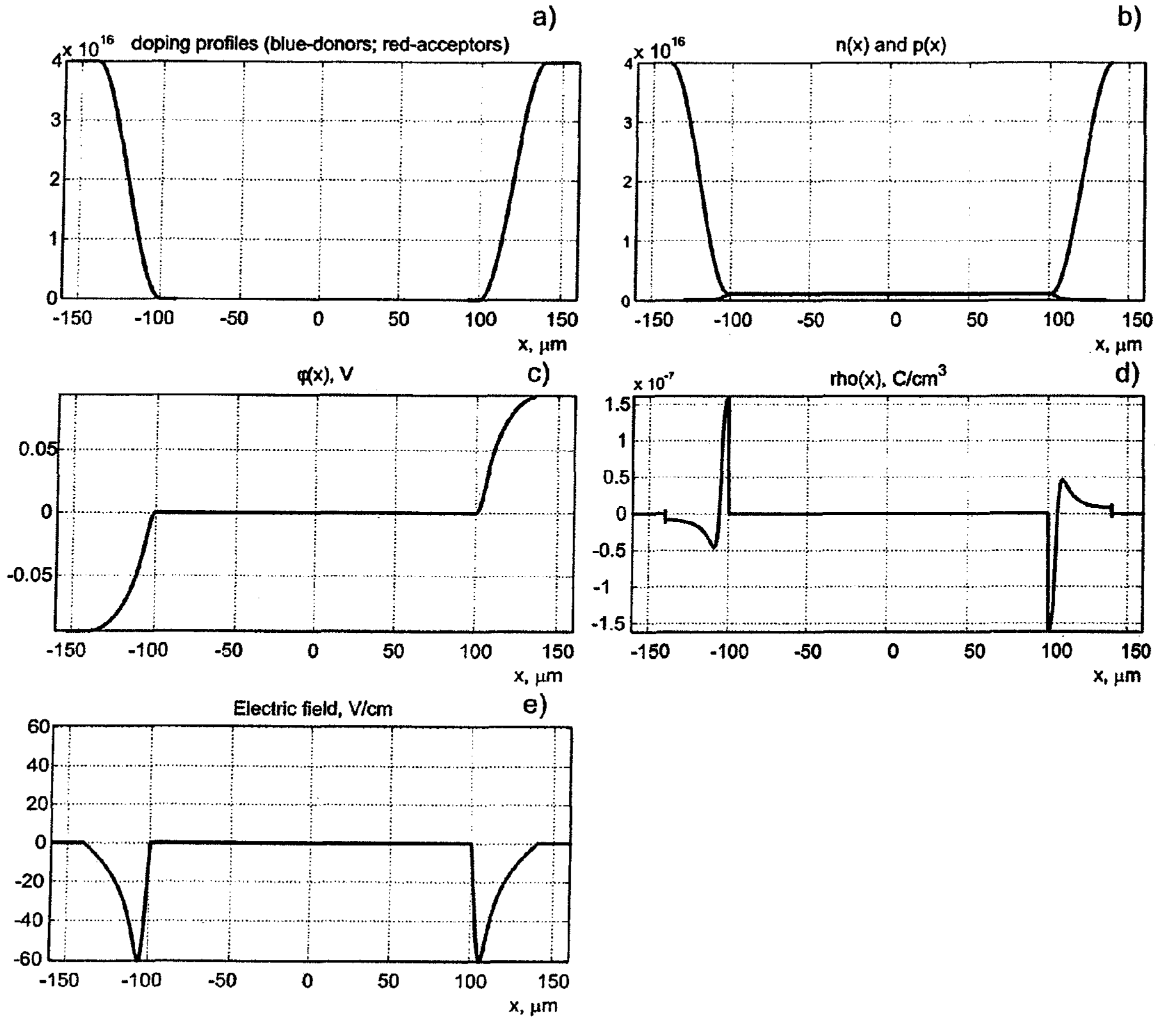
FIGS. 10*a*-10*e* show, for the same embodiment are in FIGS. 9*a*-9*e*, the same data as in FIGS. 9*a*-9*e*, but for the forward-bias voltage of +0.6V.

Approximation of the electric field region described in B. R. Chawla and H. K. Gummel, "Transition region capacitance of diffused p-n junctions," *IEEE Trans. on Electron Devices*, vol. ED-18, no. 3, March 1971, pp. 178-195, which is incorporated by reference herein in its entirety, was used to model the pin-junction. FIG. 9*a* shows the corresponding doping profiles, FIG. 9*b*—the free-carrier profiles, FIG. 9*c* gives the electric potential distribution, FIGS. 9*d, e* show charge density and the electric field distribution, respectively. The applied bias voltage is about −1000V.

The (large) reverse-bias voltage slightly widens the depletion region (the i-region) as seen in FIG. 9*b*. For larger terminal doping concentrations, this effect becomes less profound, but it increases for smaller doping concentrations. The carrier concentration in the entire depletion region is close to the intrinsic concentration, $n_i \approx 1\times10^{10}$ $cm^{-3}$.

However, a positive bias voltage leads to a flood of free carriers into the intrinsic region so that this region becomes conducting, quite similar to the depletion region of the pn-junction. As an example, FIGS. 10*a*-10*e* show the same pin junction profiles as in FIGS. 9*a*-9*e*, but for the forward bias voltage of +0.6V, which is slightly less than the built-in voltage of 0.79V. One can see very significant carrier concentrations in the intrinsic region, both of them are equal to $1.0\times10^{15}$ $cm^{-3}$. The solution in FIGS. 10*a*-10*e* ignores carrier recombination in the depletion region. The larger the width of the intrinsic Si layer is the better antenna efficiencies can be obtained. Si power pin diodes may have a large width of the intrinsic or compensated Si. As a base example we consider an experimental wide pin-junction, from M. Isberg, P. Jonsson, N. Keskitalo, F. Masszi, and H. Bleicher, "Physical models in device simulation of SI power pin diodes for optimal fitting of simulation results to measured data," Compel (*Int. Journal for Computation and Mathematics in Electrical and Electronic Engineering*), vol. 16, no. 3, 1997, pp. 144-156 which is incorporated by reference herein in its entirety, that has i. the width of the intrinsic (strictly speaking, $n^-$) region h of 370 μm;

ii. $N_D$ and $N_A$ of $4\times10^{19}$ $cm^{-3}$ (resistivities of 0.0018 and 0.0028 Ω·cm, respectively);

iii. total diode area of approximately 10 $mm^2$.

The efficiency was calculated for the square patch (W=L). The antenna height is exactly the width of the i-Si (or weakly-doped Si) region (370 μm). The minimum antenna thickness and is 370 μm plus twice the skin layer width from either side. The calculations are assembled in a MATLAB script. From the results of the calculations, it can be concluded that, for the embodiment presentable, the pin-junction may serve as a patch antenna starting with frequencies f≧50 GHz (the efficiency is greater than 50%). At 50 GHz, the minimum antenna thickness is 0.4 mm. To move down to lower frequencies (e.g. to the X-band), the antenna thickness should be larger. The calculations also indicate that the Si pin-junction can be used in the 60 GHz band and in the low-THz range.

Other Embodiments

Wafer design: A series of 100 m antenna wafers have been used with semiconductor patch antennas. Silicon wafers may have, although not limited thereto, the parameters listed in Table 1, below, with estimated carrier concentrations:

TABLE 1

| Layer/Thickness | Doping | Carrier concentration, 1/cm$^3$ |
|---|---|---|
| N<br>20 ± 0.5 μm | Sb (Antimony)<br>0.005-0.020 OHM-CM | ~$4\times10^{18}$ |
| Buried oxide,<br>0.25 μm ± 5% | $SiO_2$ | None |
| P<br>500 ± 15 μm | B (Boron)<br>0.005-0.020 OHM-CM | ~$1\times10^{19}$ |

The built-in voltage of the junction is given by (the abrupt-junction approximation):

$$V_{bi} = V_T \ln\left(\frac{N_D N_A}{n_i^2}\right)$$

-continued $$= 0.026\ln\left(\frac{4\times10^{18}\times1\times10^{19}}{10^{20}}\right) \approx 1.0\ \text{V}$$

The depletion layer width W is given by:

$$W = \sqrt{\frac{2\varepsilon_{Si}}{q}\frac{(N_A+N_D)}{N_AN_D}V_{bi}} = \sqrt{\frac{2\times12\times8.854\times10^{-12}}{1.602\times10^{-19}}\frac{(N_A+N_D)}{N_AN_D}V_{bi}} \approx 22\ \mu\text{m}$$

Thus, the junction has a wide depletion layer with $\in_r=12$ (intrinsic Si). The oxide layer is approximately 100 times thinner and will be ignored in the antenna design below.

Antenna design and measurement: An example, but not limited thereto, of a semiconductor patch antenna design without a ground plane is listed in Table 2, below. Here, a number of rectangular patches were cut with a diamond saw. The patch resonates along its longer dimension. The semiconductor patch antenna was designed for the S-band as follows, although not limited thereto:

TABLE 2

| | |
|---|---|
| Patch length L (resonant length) | 20 mm |
| Patch width D | 13 mm |
| Resonant frequency, from $L = \frac{0.49c_0}{\sqrt{\varepsilon_r}\,f_{res}}$ | 2.13 GHz |

Figure 11:
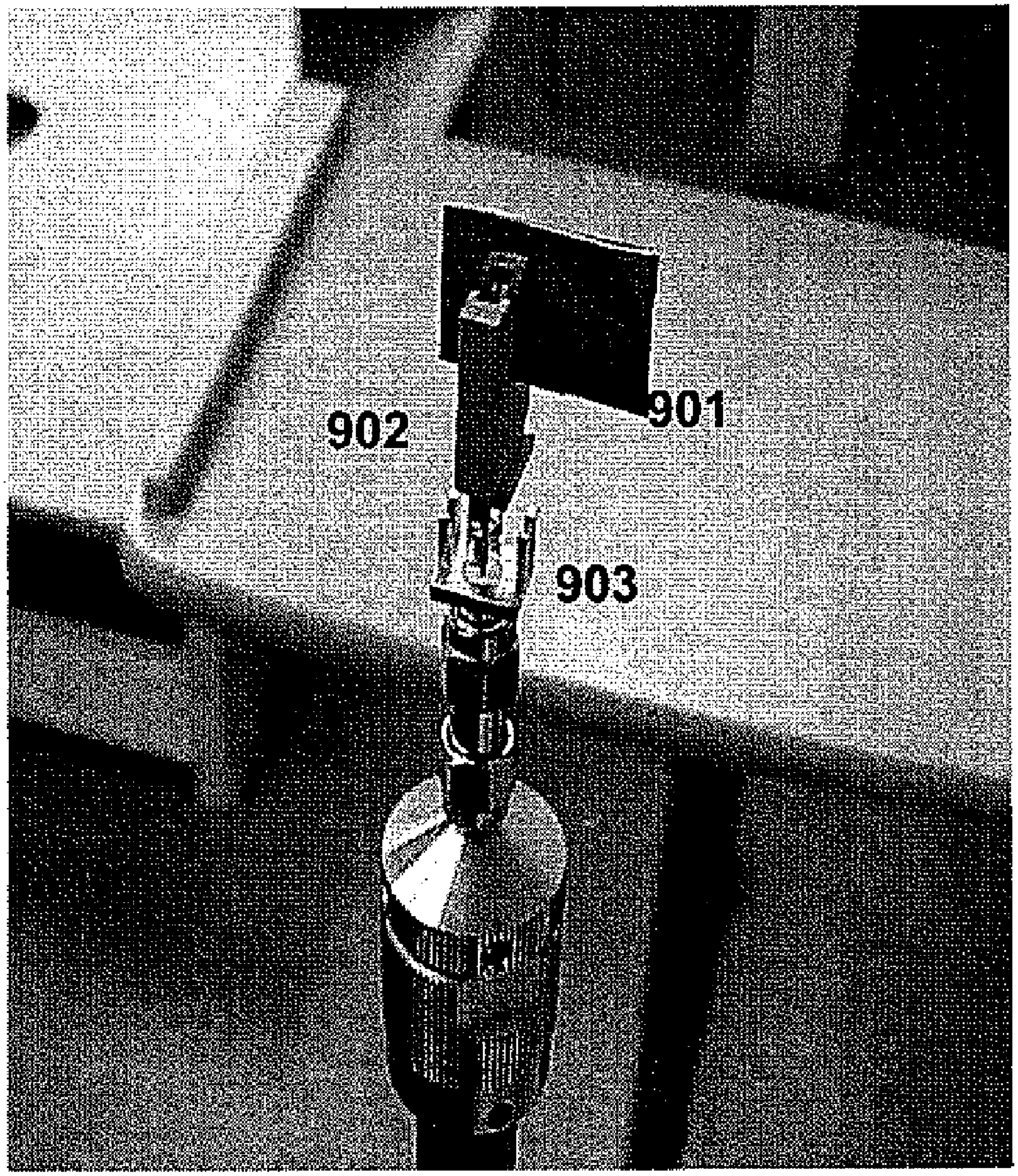
FIG. 11 is a photograph of one embodiment of the semiconductor patch antenna.
Figure 12:
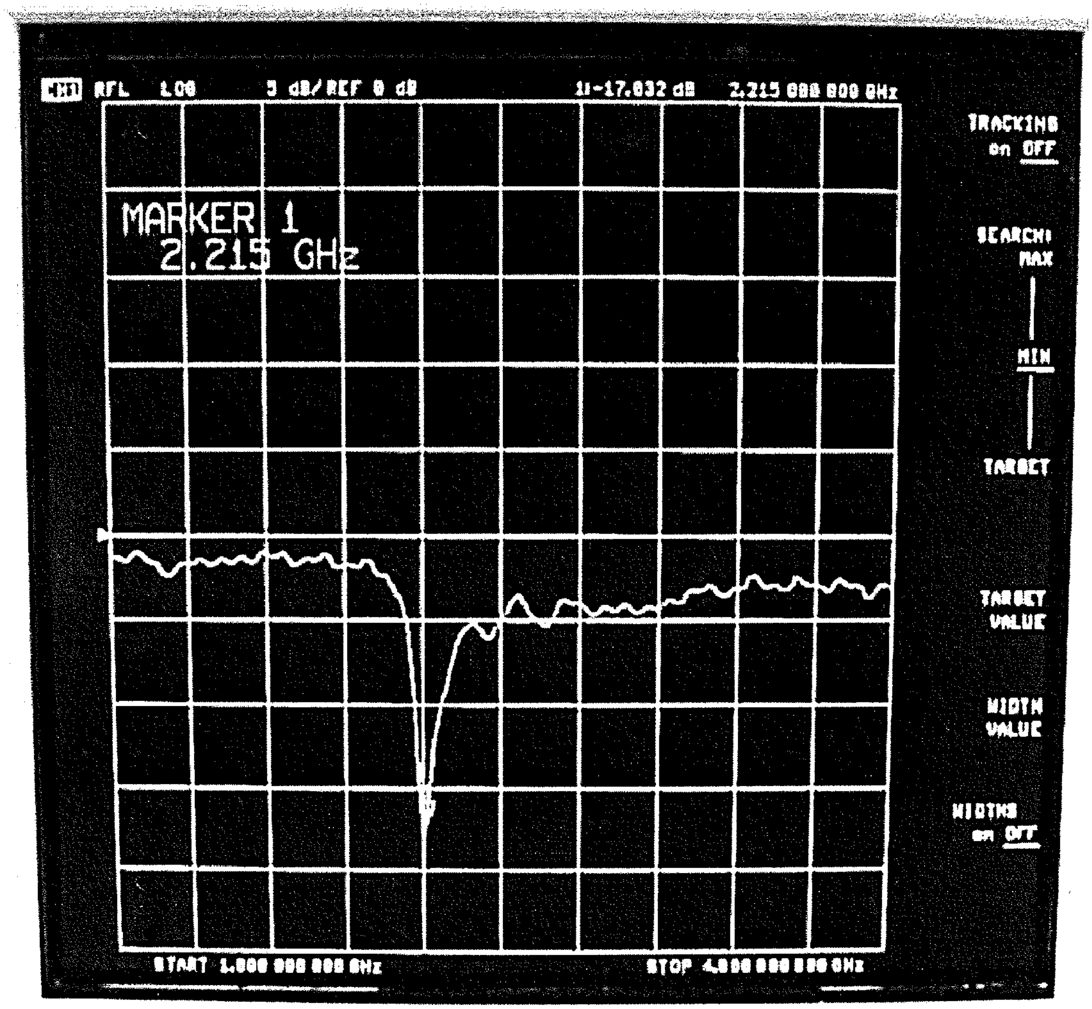
FIG. 12 is a graph showing the typical $S_{11}$ measurement result (return loss) for a 20×13 mm semiconductor patch antenna.

Referring now to FIG. 11, shown is a photograph of one embodiment of the semiconductor patch antenna 901. The semiconductor patch antenna 901 may be cut from a pin junction wafer or a pn-junction 100 (shown in FIG. 1) wafer and supported by a two-electrode flexible string holder 902 soldered to the coaxial male connector 903. By varying the antenna position within the two-electrode flexible string holder 902 the best match to, for example, 50 Ohm, may be achieved.

Referring now to FIG. 11, shown is a graph showing the typical $S_{11}$ measurement result (return loss) for a 20×13 mm semiconductor patch antenna described hereinabove. The semiconductor patch antenna may resonate at 2.21 GHz, although not limited thereto. This value deviates by 4% from the theoretical prediction which may be explained by neglecting the effect of the oxide layer.

The resonance is highly repetitive and has been established for four consecutive measurements with a resonant frequency deviation of about 1%. One major source for deviation is the string holder. The $S_{11}$ measured for the holder without the antenna shows nearly the same amount of loss in the flat region of $S_{11}$.

The embodiments shown above do not include a metal ground plane and/or a metal plate.

Although embodiments disclosed above utilizes a silicon ("Si") or Gallium Arsenide wafer, this is not a limitation of these teachings. Exemplary materials utilized for the semiconductor material, either n-doped or p-doped or intrinsic, include, but are not limited to, Silicon ("Si)", Germanium ("Ge"), Gallium Arsenide ("GaAs"), Indium Gallium Arsenide ("InGaAs"), Indium Phosphide ("InP"), Aluminum Gallium Arsenide ("AlGaAs"), Silicon Carbide ("SiC"), Gallium Nitride ("GaN"), Gallium Antiminide ("GaSb"), Gallium Phosphide ("GaP"), Indium Gallium Phosphide ("InGaP"), Aluminum Gallium Phosphide ("AlGaP"), Aluminum Gallium Nitride ("AlGaN"), Indium Arsenide ("InAs"), Indium Aluminum Arsenide ("InAlAs"), Silicon Germanium ("SiGe"), Diamond ("C" (diamond)), Aluminum Nitride ("AlN"), Cadmium Telluride ("CdTe"), Mercury Cadmium Telluride ("HgCdTe"), Indium Antiminide ("InSb").

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

While the present teachings have been described above in terms of specific embodiments, it is to be understood that they are not limited to these disclosed embodiments. Many modifications and other embodiments will come to mind to those skilled in the art to which this pertains, and which are intended to be and are covered by this disclosure. It is intended that the scope should be determined by proper interpretation and construction of the disclosure, as understood by those of skill in the art relying upon the disclosure in this specification and the attached drawings and the appended claims.

What is claimed is:

1. An antenna comprising:

a p-doped layer; and an n-doped layer; said n-doped layer disposed below said a p-doped layer and constituting a pn junction; a depletion region of the pn junction being a resonating volume of the antenna;

the antenna not including a metal ground plane; wherein the antenna is a patch antenna.

2. The antenna of claim 1 wherein the antenna also does not include a metal patch disposed over one layer from said p-doped layer or said n-doped layer.

3. The antenna of claim 1 further comprising:

a DC voltage source connected from said p-doped layer to said n-doped layer;

said DC voltage source enabling antenna tunability.

4. An antenna comprising:

a p-doped layer;

an n-doped layer; said n-doped layer disposed below said a p-doped layer;

the antenna not including a metal ground plane; and an intrinsic semiconductor layer disposed between and substantially in contact with said p-doped layer and said n-doped layer.

5. An antenna comprising:

a p-doped layer;

an n-doped layer; said n-doped layer disposed below said a p-doped layer;

the antenna not including a metal ground plane; and an oxide layer disposed between and substantially in contact with said p-doped layer and said n-doped layer.

6. An antenna comprising: a p-doped layer; and an n-doped layer; said n-doped layer disposed below said a p-doped layer and constituting a pn junction; a depletion region of the pn junction being a resonating volume of the antenna; the antenna not including a metal patch; wherein the antenna is a patch antenna.

7. The antenna of claim 6 wherein the antenna also does not include a metal ground plane disposed over one layer from said p-doped layer or said n-doped layer.

8. The antenna of claim 6 further comprising:

a DC voltage source connected from said p-doped layer to said n-doped layer;

said DC voltage source enabling antenna tunability.

9. An antenna comprising:

a p-doped layer;

an n-doped layer; said n-doped layer disposed below said a p-doped layer;

the antenna not including a metal patch; and an intrinsic semiconductor layer disposed between and substantially in contact with said p-doped layer and said n-doped layer.

10. An antenna comprising:

a p-doped layer;

an n-doped layer; said n-doped layer disposed below said a p-doped layer;

the antenna not including a metal patch; and an oxide layer disposed between and substantially in contact with said p-doped layer and said n-doped layer.

* * * * *